United States Patent
Kim

(10) Patent No.: US 7,821,841 B2
(45) Date of Patent: Oct. 26, 2010

(54) METHOD OF DETECTING A LIGHT ATTACK AGAINST A MEMORY DEVICE AND MEMORY DEVICE EMPLOYING A METHOD OF DETECTING A LIGHT ATTACK

(75) Inventor: Minkyu Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 89 days.

(21) Appl. No.: 12/248,200

(22) Filed: Oct. 9, 2008

(65) Prior Publication Data

US 2009/0097328 A1    Apr. 16, 2009

(30) Foreign Application Priority Data

Oct. 9, 2007    (KR) .................... 10-2007-0101207

(51) Int. Cl.
*G11C 11/34* (2006.01)
*G11C 16/04* (2006.01)
*G11C 7/00* (2006.01)

(52) U.S. Cl. ................ 365/185.32; 365/189.08; 365/195

(58) Field of Classification Search ........... 365/185.32, 365/195
See application file for complete search history.

(56) References Cited

U.S. PATENT DOCUMENTS

| 5,550,494 | A | * | 8/1996 | Sawada | ............... | 327/69 |
| 2007/0217277 | A1 | * | 9/2007 | Kuenemund | ........... | 365/227 |
| 2008/0135966 | A1 | * | 6/2008 | Kim | ................... | 257/433 |
| 2008/0266989 | A1 | * | 10/2008 | Wood | ................ | 365/190 |

* cited by examiner

*Primary Examiner*—Ly D Pham
(74) *Attorney, Agent, or Firm*—Volentine & Whitt, PLLC

(57) ABSTRACT

A memory device having a plurality of memory cells employs a method to detect a light attack on the memory device. The method utilizes at least one memory cell to detect a light attack when the memory cell is in an inactive state, and outputs a signal indicating whether a light attack is detected. In one case, the method includes turning off all of the memory cells of memory blocks of the memory device that are not currently being accessed for a read/write operation; sensing a leakage current of at least one of the memory cells of the memory blocks that are not currently being accessed for a read/write operation; and detecting a light attack on the memory device when a leakage current of the one of the memory cells of the memory blocks that are not currently being accessed for a read/write operation is greater than a threshold.

33 Claims, 7 Drawing Sheets

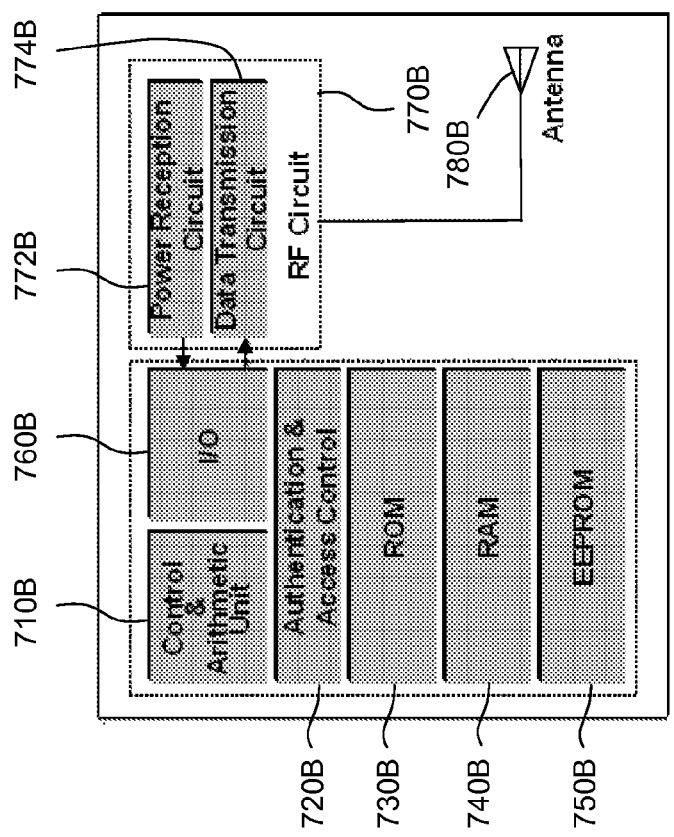
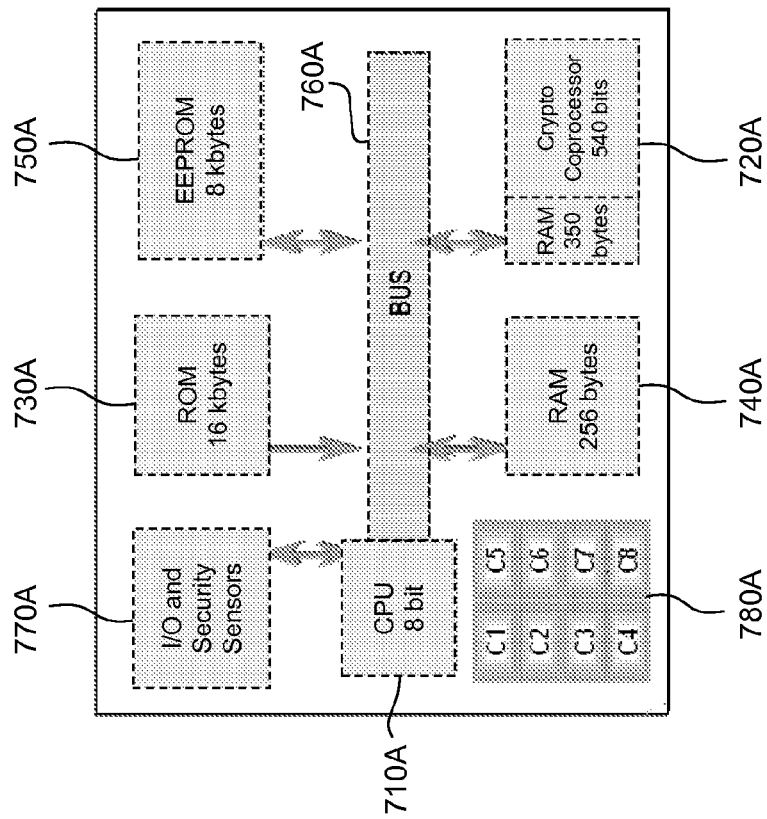
FIG. 7B
FIG. 7A

METHOD OF DETECTING A LIGHT ATTACK AGAINST A MEMORY DEVICE AND MEMORY DEVICE EMPLOYING A METHOD OF DETECTING A LIGHT ATTACK

CROSS-REFERENCES TO RELATED APPLICATIONS

This application claims priority under 35 U.S.C. §119 from Korean Patent Application 2007-0101207, filed on 9 Oct. 2007 in the name of Min kyu Kim, the entirety of which is hereby incorporated by reference for all purposes as if fully set forth herein.

BACKGROUND AND SUMMARY

1. Field

This invention pertains to the field of memory devices and smart cards having memory devices, and more particularly, to memory devices and smart cards employing methods to for detecting attacks, and specifically light attacks.

2. Description

Smart cards have integrated circuit (IC) chips which may include embedded microprocessors, card operating systems, security modules, and memories therein. Unless other cards that just have a memory, smart cards can perform various specific operations, such as arithmetic operations, data encryption and decryption, bidirectional communication etc. Operations for reading, writing, and erasing data and programs stored in a smart card, and communications between a smart card and an external system, and strictly controlled and protected from unauthorized access or interference by built-in security functions and elaborate encryption algorithms.

In general smart cards can be divided into contact type smart cards and contactless smart cards.

FIG. 7A shows a functional block diagram of a contact type smart card 700A. Smart card 700A includes a central processing unit 710A and a crypto coprocessor 720A connected to a read only memory (ROM) 730A, a random access memory (RAM) 740A, and an electrically erasable programmable read only memory (EEPROM) 750A via a bus 760A. Smart card 700A also includes input/output circuits and security sensors 770A and a bank of electrical contacts 780A. In one embodiment, electrical contacts 780A includes a VCC contact C1, a reset (RST) contact C2, a clock contact C3, a ground contact C5, and a VPP contact C7. Contacts C4 and C8 are reserved.

FIG. 7B shows a functional block diagram of a contactless smart card 700B. Smart card 700B includes control and arithmetic unit 710B, authentication and access control 720B, ROM 730B, RAM 740B, EEPROM 750B, I/O 760B, RF circuit 770B (including power reception circuit 772B and data transmission circuit 774B) and an antenna 780B.

Smart cards are increasingly used in a variety of applications, where identification and authentication are important. Such applications may include banking transactions, credit transactions, point of sale purchases, mobile telephones, conditional access to video and audio programs, personal access to secure facilities, etc.

Fir these applications, smart cards are generally required to store sensitive information, such as account numbers, access codes, personal data, etc. Therefore, it is essential for the internal information of smart cards to be secure in order to safely employ such cards in these applications.

With the expansion in the use of smart cards, there are increasing efforts to develop techniques for "attacking" the smart cards so as to defeat their security measures and obtain access to the sensitive information utilized by the smart cards for pecuniary gain. In general, unauthorized access to the smart card is called "tampering." Tampering techniques include microprobing, software attacks, eavesdropping and fault generation.

A microprobing technique may be used for directly accessing the surface of an IC chip. A software attack is operable with a general communication interface, utilizing security vulnerability arising from protocols, an encryption algorithm, or execution of an algorithm. An eavesdropping technique is carried out by evaluating analog characteristics of the power supplies and interfaces of the smart card and analyzing electromagnetic generated from a processor during normal operations. A fault generation technique operates to create a malfunction of a processor to provide an additional access by means of abnormal environment conditions. The microprobing technique is a kind of invasive attack, requiring a lot of time. The other techniques are kinds of non-invasive attacks.

One type of non-invasive attack is a glitch attack technique. The glitch attack technique attempts to "hack" a smart card by applying an external signal thereto or an abnormal signal to its power supply so as to make the smart card operate irregularly.

In recent years, an attacking technique has been developed for changing data in a smart card by means of a laser light which can be controlled to be emitted onto very localized areas of the smart card.

Accordingly, it would be desirable to provide a method of detecting a light attack on a memory device. It would also be desirable to provide a memory device that can detect such a light attack. It would further be desirable to provide a smart card that can detect a light attack on a memory device embedded into the smart card.

The present invention is directed to a method of detecting a light attack in a memory device, and a memory device employing such a method.

In one aspect of the inventive concept, a method is provided for detecting a light attack on a memory device having a plurality of memory blocks each including a plurality of memory cells. The method comprises: turning off all of the memory cells of memory blocks of the memory device that are not currently being accessed for a read/write operation; sensing a leakage current of at least one of the memory cells of the memory blocks that are not currently being accessed for a read/write operation; and detecting a light attack on the memory device when a leakage current of the one of the memory cells of the memory blocks that are not currently being accessed for a read/write operation is greater than a threshold.

In another aspect of the inventive concept, a method is provided for detecting a light attack on a memory device having a plurality of memory cells. The method comprises: turning off all of the memory cells of the memory device when the memory device is not currently being accessed for a read/write operation; sensing a leakage current of at least one of the memory cells of the memory device when the memory device is not currently being accessed for a read/write operation; and detecting a light attack on the memory device when the leakage current of the one of the memory cells of the memory device is greater than a threshold when the memory device is not currently being accessed for a read/write operation.

In yet another aspect of the inventive concept, a method is provided for detecting a light attack on a memory device having a plurality of memory cells. The method comprises employing at least one memory cell to detect a light attack on the memory device when the memory cell is in an inactive state, and outputting a signal indicating whether a light attack is detected.

In still another aspect of the inventive concept, a memory device comprises: a plurality of memory cells; an arrangement for turning off all of the memory cells in response to a security detection enable signal; and a detection circuit operatively connected to the memory cells for detecting leakage currents of the turned-off memory cells and for detecting a light attack on the memory device when the leakage current of one of the memory cells of the memory device is greater than a threshold.

In a further aspect of the invention, a smartcard comprises a processor; a memory interface unit adapted to receive memory access instructions from the processor; a memory device; a bus connecting the processor, the memory interface unit and the memory device; and a security detection enable controller adapted to generate a security detection enable signal in response to the memory access instructions. The memory device comprises a plurality of memory cells, wherein a memory cell is part of a light attack detection means for the memory device when the memory cell is in an inactive state.

In a still further aspect of the invention, a smartcard comprises: a processor; a memory interface unit adapted to receive memory access instructions from the processor; a memory device; a bus connecting the processor, the memory interface unit and the memory device; a security detection enable controller adapted to generate a security detection enable signal in response to the memory access instructions. The memory device comprises: a plurality of memory cells; an arrangement for turning off all of the memory cells in response to the security detection enable signal; and a detection circuit operatively connected to the memory cells for detecting leakage currents of the turned-off memory cells and for detecting a light attack on the memory device when the leakage current of one of the memory cells of the memory device is greater than a threshold.

BRIEF DESCRIPTION OF THE DRAWINGS

FIG. 7A shows a functional block diagram of a contact type smart card.

FIG. 7B shows a functional block diagram of a contactless smart card.

DETAILED DESCRIPTION

Figure 1:
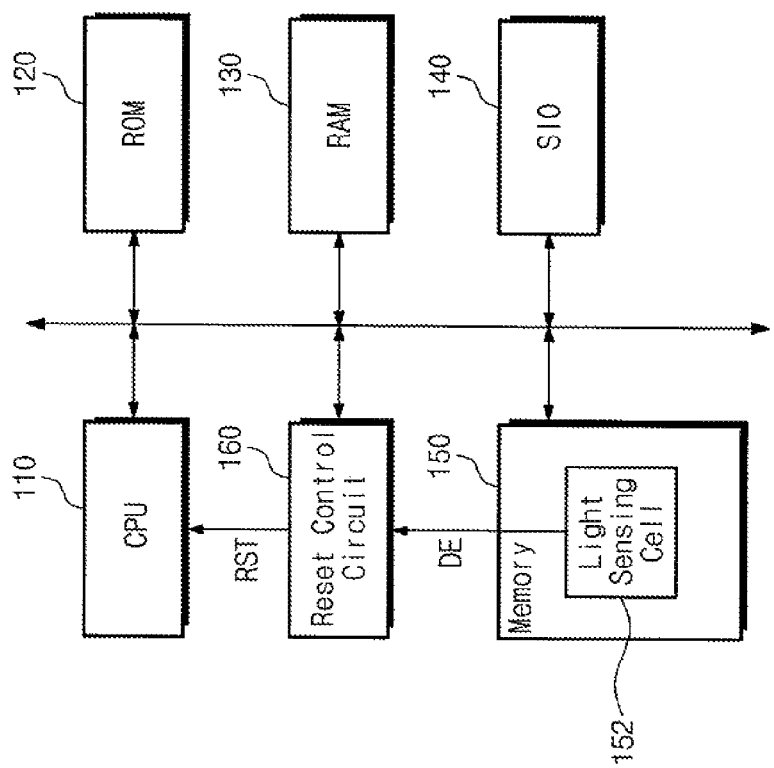
FIG. 1 shows a block diagram of a smart card including one or more light sensors.

FIG. 1 shows a block diagram of a smart card 10 including one or more light sensors. Smart card 10 includes central processing unit (CPU) 110, read only memory (ROM) 120, random access memory (RAM) 130, serial input/output (SIO) interface 140, memory device 150, and a reset control circuit 160.

CPU 110 controls the overall operation of smart card 10. ROM 120 is typically programmed basic commands and a card operating system (COS) for managing the IC chip of smart card 10. RAM 130 is sued for managing temporary data and storing intermediate results of calculations made by CPU 110. SIO interface 140 is provided to transmit and receive data between smart card 10 and an external device (not shown).

Reset control circuit 160 includes various kinds of detectors for detecting abnormal states of smart card 10. Although not specifically shown in FIG. 1, reset control circuit includes various kinds of detectors for sensing abnormal states of smart card 10 which may indicate external attacks on smart card 10 by unauthorized users. Such detectors may include an exposure detector, a frequency detector, a voltage detector and a temperature detector. The exposure detector generates a reset signal RST when it detects that the chip surface is exposed to light in an effort to remove a silicon oxide film that is used as a protection layer in smart card 10. The frequency detector detects a frequency of the main clock signal and generates the reset signal RST when the detected frequency is outside of an expected frequency range. The voltage detector detects a voltage of an externally supplied power source (e.g., from a card reader) and generates the reset signal RST when the detected voltage is outside of an expected voltage range. The temperature detector detects a temperature of smart card 10 and generates the reset signal RST when the detected temperature is outside of an expected temperature range. In response to reset signal RST, the smart card 10 is reset to foil an attack.

Memory device 150 stores user information that needs to be protected from an external attack. For example, memory device 150 may store card issuer data, user data, and data applicable to various operations performs by smart card 10. Memory device 150 includes normal data storage memory cells (not shown) and a plurality of dedicated light sensing cells 152 that do not store data. The light sensing cells 152 each sense light irradiated thereon and in response generate a light detection signal which is provided to reset control circuit 160. In response to the light detection signal, reset control circuit 160 generates the reset signal RST, thereby resetting smart card 10.

However, the light sensing cells 152 occupy valuable space in an integrated circuit for the smartcard.

Figure 2B:
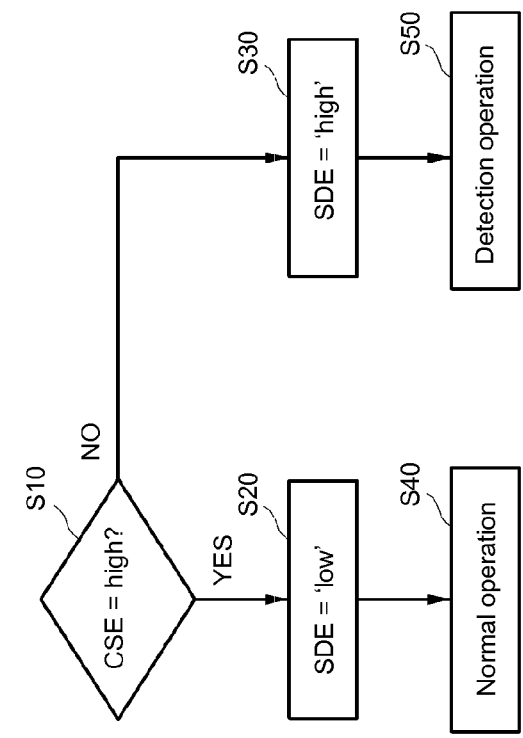
FIG. 2B shows a flowchart for explaining a method of detecting a light attack against the smart card illustrated in FIG. 2A.
Figure 2A:
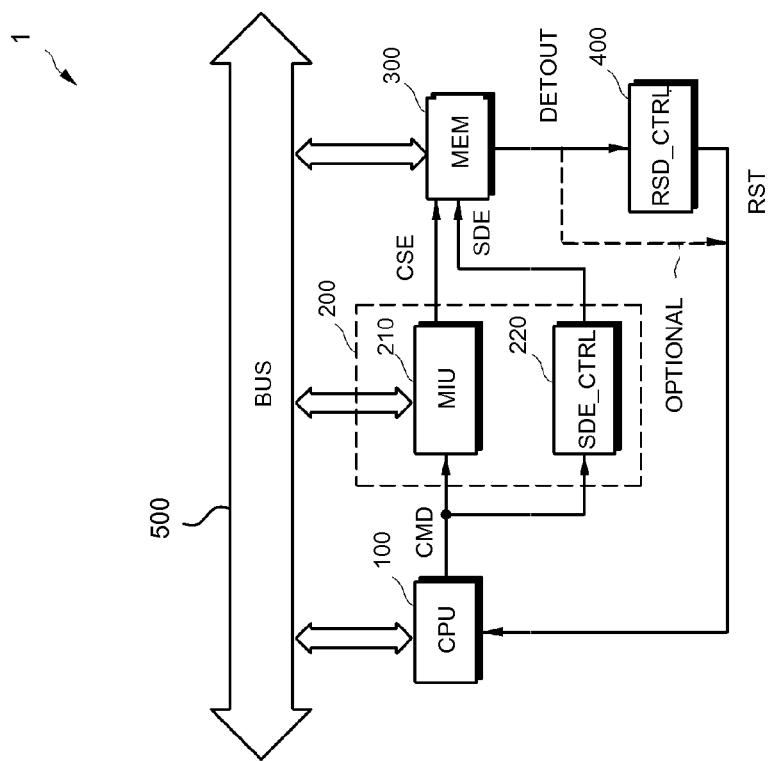
FIG. 2A shows a block diagram of one embodiment of a smart card including a capability of detecting a light attack.

FIG. 2A shows a block diagram of one embodiment of a smart card 1 including a capability of detecting a light attack. Smart card 1 includes a CPU 100 and a memory device 300 connected by means of a data bus 500. Smart card 1 also includes a memory controller 200 and a reset detection controller (RSD_CTRL) 400. Memory controller 200 includes a memory interface unit 210 and a Security Detection Enable controller (SDE_CTRL) 220.

Operationally, when CPU 100 issues a command for memory device 300, MIU 210 interprets the command and delivers the appropriate signals to memory device 300. Data is exchanged between CPU 100 and memory device 230 via data bus 500.

Beneficially, memory controller 200 allocates time for memory device 300 to perform an attack detection procedure, when memory device 300 is idle. Memory device 300 becomes active when MIU 210 drives a chip select enable signal (CSE) for the chip as shown in FIG. 2A to be in an ACTIVE state (e.g., "high"). SDE_CTRL 220 generates a Security Detection Enable (SDE) signal during an idle time when MIU 210 does not access memory device 300. The SDE signal initiates the detection procedure.

FIG. 2B shows a flowchart for explaining a method of detecting a light attack against smart card 1.

In a step S10, it is determined whether or not memory device 300 is active according to whether MIU 200 sets CSE to be in ACTIVE state (e.g., "high") or not.

At a time when CSE is INACTIVE (e.g., "low") indicating that memory device 300 is not being used for a read or write operation, then in a step S30 the SDE signal becomes ACTIVE (e.g., "high") enabling memory device 300 to detect a light attack In response to SDE becoming ACTIVE (e.g., "high"), memory device 300 performs a light detection process to determine whether or not memory device 300 is being exposed to unintended light which may corrupt its data. When memory device 300 detects a light attack, then it generates a light attack detection signal DETOUT. The light attack detection signal DETOUT is provided to RSD_CTRL 400. In response to the DETOUT signal being ACTIVE, indicating that a light attack has been detected, RSD_CTRL 400 may send a reset signal RST to CPU 100, thereby resetting the memory contents. Optionally, RSD_CTRL 400 can be bypassed and the light attack detection signal DETOUT can be provided to CPU 100.

Figure 3:
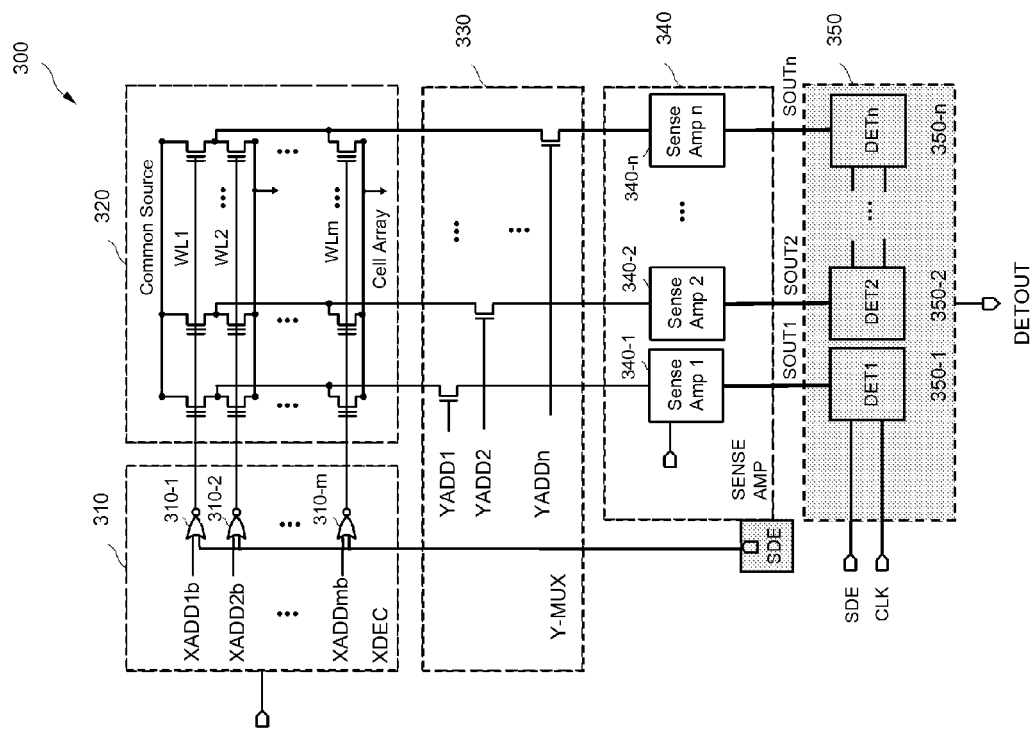
FIG. 3 shows a block diagram of a memory device including a capability of detecting a light attack.

FIG. 3 shows a block diagram of a memory device 300 including a capability of detecting a light attack. Memory device 300 includes security detection enable (SDE) circuit 310, a cell array 320, a column multiplexer 330, a sense amplifier block 340, and a detection circuit 350. Cell array 320 includes a plurality of memory cells. The memory cells in cell array 320 can be NOR cells, split-gate cells, stacked-gate cells, or other appropriate devices. Sense amplifier block 340 includes a plurality of sense amplifiers 340-1~340-n connected to column lines of cell array 320 by column multiplexer 330. Detection circuit 350 includes a plurality of detectors 350-1~350-n connected to corresponding sense amplifiers 340-1~340-n.

An attack detection operation of memory device 300 will now be explained with reference to FIG. 3. When an attack detection procedure is initiated (e.g., by SDE_CTRL 220 in FIG. 2A), then the SDE signal becomes ACTIVE (e.g., "high"). In response to the SDE signal being ACTIVE (e.g., "high"), all of the word lines WL1~WLm of cell array 320 are in an INACTIVE or non-driving state by operation of the NOR gates in SDE circuit 310. Accordingly, the gate of each memory cell is "closed" and all of the memory cells in cell array 320 are "off." In that case, the output of the memory cells should be at a low or "off" level. At this time, sense amplifier block 340 continues to operate.

Memory cells of cell array 320 sense locally irradiated light from a light attack as follows. When a hacker irradiates light (e.g., a laser) on cell array 320 while memory device 300 is in an inactive state, a leakage current is generated in the memory cells of cell array 320 by the irradiated light. The leakage current is transferred to sense amplifier 340 by way of a column address signal YADD1~YADDn applied to column multiplexer 340. Sense amplifiers 340-1~340-n output corresponding sensed current output signals SOUT-1~SOUT-n which indicate whether the leakage current of one or more of the memory cells connected to the sense amplifier is greater than a threshold. Detectors 350-1~350-n receive corresponding sensed current output signals SOUT-1~SOUT-n and determine from the levels of sensed current output signals SOUT-1~SOUT-n whether or not the leakage current is generated in the memory cells of cell array 320 by irradiated light from a light attack.

If the output of a memory cell is higher than a threshold that may be set according to its usual low level value, then data may be experiencing corruption due to light from a light attack upon memory device 300. Sense amplifiers 340-1~340-n each output a sensed current output signal SOUT-1~SOUT-n that indicates whether the leakage current of a memory cell connected to the sense amplifier is greater than a threshold value for detecting a light attack. Detector circuit 350 generates the light attack detection signal DETOUT in response to the sensed current output signals SOUT-1~SOUT-n.

Figure 4A:
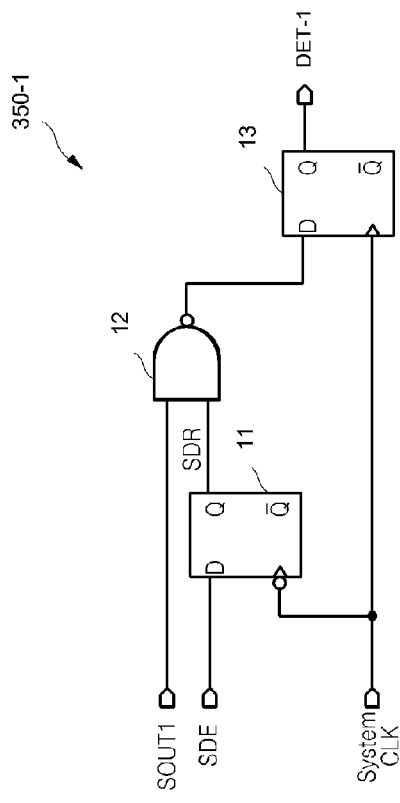
FIG. 4A illustrates one embodiment of a detector which may be employed in the memory device of FIG. 3.

FIG. 4A illustrates one embodiment of a detector 350-1 which may be employed in detection circuit 350 of memory device 300. Any or all of detectors 350-1~350-n can have the same configuration shown in FIG. 4A. Detector 350-1 includes a first latch 11, a first logic circuit (e.g., a NAND gate) 12, and a second latch 13.

Figure 4B:
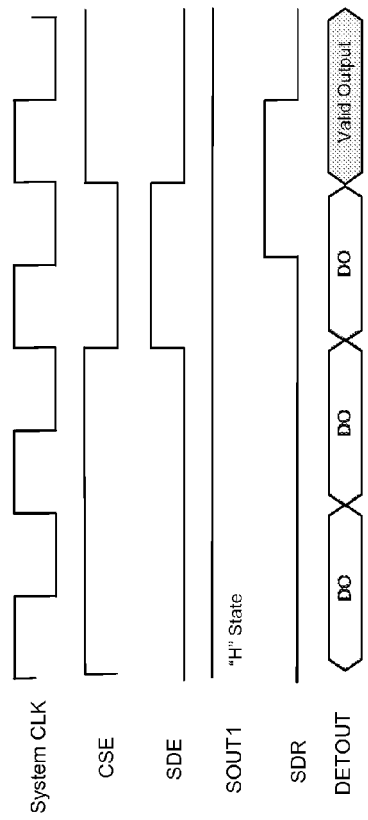
FIG. 4B shows a timing diagram illustrating an operation of the detection circuit of FIG. 4A.

FIG. 4B shows a timing diagram illustrating an operation of the detection circuit of FIG. 4A.

A light detection operation of detector 350-1 is now explained with respect to FIGS. 4A-B. When a sense amplifier (e.g., 340-1) detects a leakage current while memory device 300 is in a light detection mode by setting the SDE signal to be ACTIVE (e.g., "high"), then the sensed current output signal SOUT-1 goes "high." Detector 350-1 samples the sensed current output signal SOUT-1. Logically, DET-1 becomes active to indicate that a light attack is detected when the sensed current output signal SOUT-1 is ACTIVE (e.g., "high") and the SDE signal is also ACTIVE (e.g., "high"). First latch 11 stabilizes the SDE signal by latching the SDE signal in synchronization with the clock signal CLK and outputs the latched security detection enable signal SDR. First logic circuit 12 logically combines the SDR signal and the sensed current output signal SOUT-1 and outputs a sensed leakage current signal. Second latch 13 latches the sensed leakage current signal in synchronization with the clock signal. As a result, DET-1 can be stabilized.

As can be seen from inspection of FIG. 4B, detector 350-1 samples the sensed current output signal SOUT-1 at the rising edge of system clock CLK, and generates a valid DET-1 signal at the next rising edge of the system clock CLK. Detection circuit 350 can employ a second logic circuit to combine the signals DET-1~DET-n output by detectors 350-1~350-n to produce the light attack detection signal DETOUT.

Figure 5:
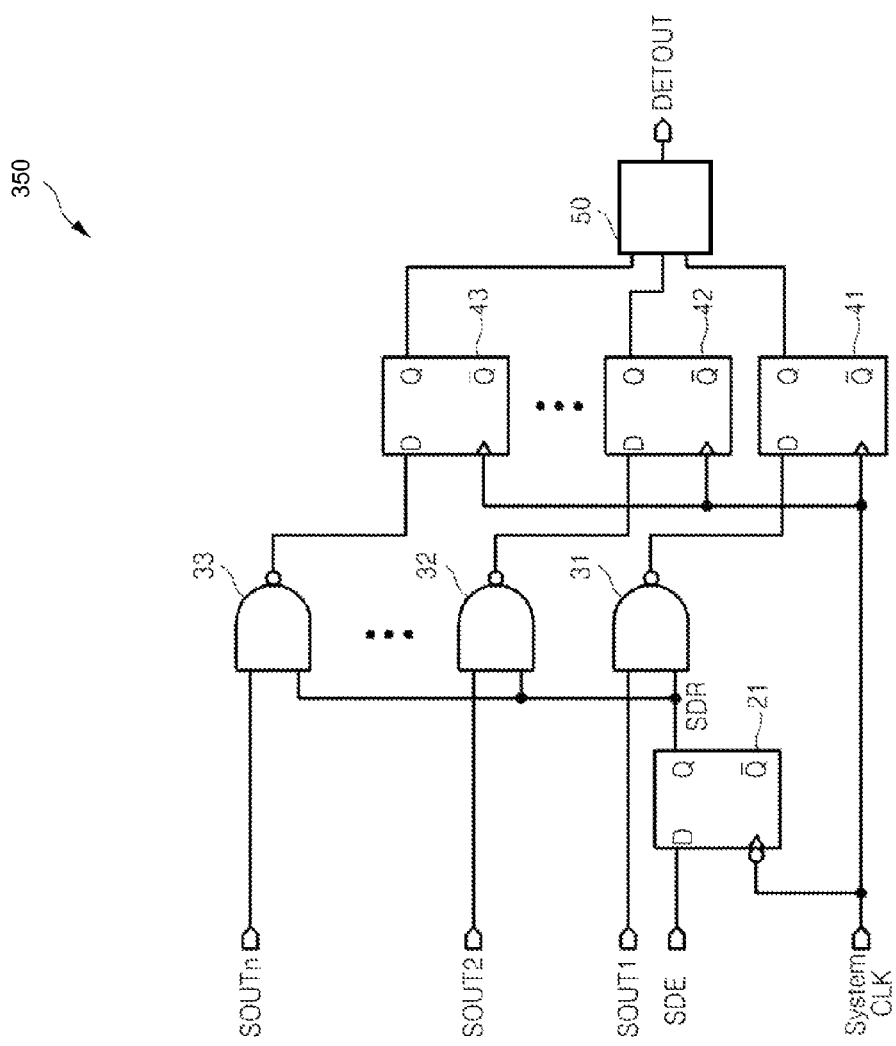
FIG. 5 illustrates one embodiment of a detection circuit which may be employed in the memory device of FIG. 3.

FIG. 5 illustrates one embodiment of a detection circuit 350 which may be employed in the memory device of FIG. 3. Detection circuit 350 includes the first latch 21, a plurality of first logic circuits 31, 32 . . . 33, a plurality of the second latches 41, 42, . . . 43 and a second logic circuit 50.

Operationally, the detection circuit 350 of FIG. 5 aggregates all the sensed current output signals SOUT-1~SOUT-n from sense amplifiers 340-1~340-n to produce the light attack detection signal DETOUT.

If one of sensed current output signals SOUT-1~SOUT-n becomes active while the memory device is not in a read or write operation (i.e., while the SDE signal is ACTIVE), indicating that a leakage current of at least one of the memory cells is greater than a threshold level, then the light attack detection signal DETOUT becomes ACTIVE to indicate detection of a light attack upon memory device 300.

Figure 6:
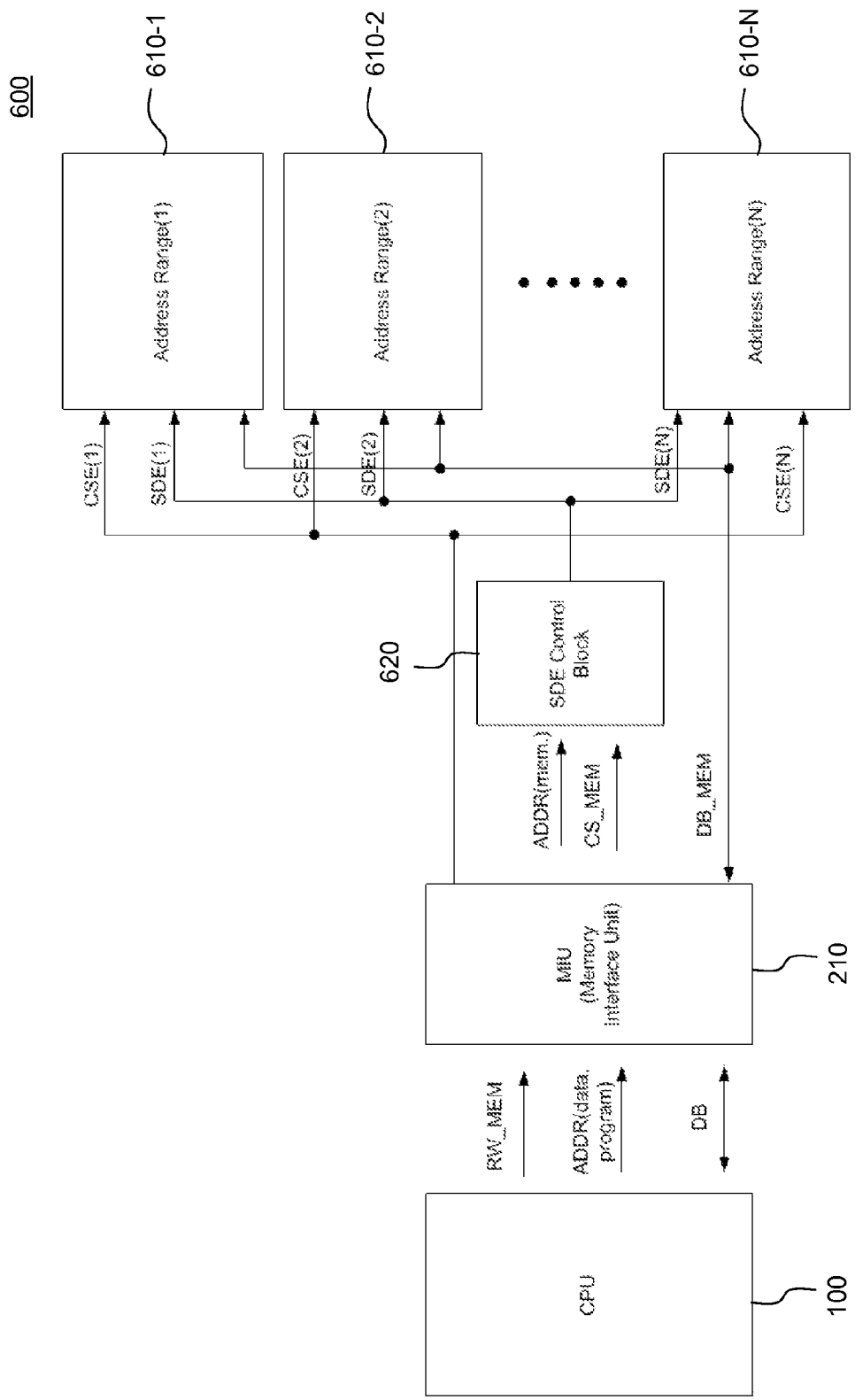
FIG. 6 shows a block diagram of an arrangement including a memory device having a capability of detecting a light attack.

FIG. 6 shows a block diagram 600 of an arrangement including a memory device having a capability of detecting a light attack. In arrangement 600, the memory device includes several memory blocks 610-1~610-n. In this case, the total memory address range, X=Address Range (1)+Address Range (2)+ . . . Address Range (N).

All the memory blocks 610-1~610-n share a same security detection control block SDE_CTRL 620 which generates SDE signals SDE(1)-SDE(n) in response to address produced by memory interface unit (MIU) 610 which is in turn generated in response to a command (including an address) from CPU 100. SDE control block 620 effectively interleaves the light detection procedure among the memory blocks 610-1~610-n as a function of time. All SDE signals SDE(1)-SDE(n) are activated at any time, except for an SDE(i) signal corresponding to a memory block 610-i currently being accessed (e.g., written to or read from) by CPU 100 via MIU 610. Each memory block 610-1~610-n that receives an ACTIVE SDE signal performs a light detection operation as described above with respect to FIGS. 2A-B through FIG. 5. Accordingly, based on the time division multiplexing method implemented by SDE control block 620, the memory device can detect a light attack.

According to embodiments as described above, no separate dedicated light detection cells are required. In such embodiments, the memory device employs at least one memory cell to detect a light attack on the memory device when the memory cell is in an inactive state.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A method of detecting a light attack on a memory device having a plurality of memory blocks each including a plurality of memory cells, the method comprising:
   turning off all of the memory cells of memory blocks of the memory device that are not currently being accessed for a read/write operation;
   sensing a leakage current of at least one of the memory cells of the memory blocks that are not currently being accessed for the read/write operation; and
   detecting a light attack on the memory device when the leakage current of the one of the memory cells of the memory blocks that are not currently being accessed for the read/write operation is greater than a threshold.

2. The method of claim 1, further comprising sensing the leakage current of all of the memory cells of the memory blocks that are not currently being accessed for the read/write operation and wherein the light attack is detected when the leakage current of any one of the memory cells of the memory blocks that are not currently being accessed for a read/write operation is greater than the threshold.

3. The method of claim 1, wherein turning off all of the memory cells of memory blocks of the memory device that are not currently being accessed for the read/write operation comprises providing a security detection enable signal to the memory blocks are not currently being accessed for the read/write operation.

4. The method of claim 3, wherein the security detection enable signal is generated in response to a select enable signal for each memory block.

5. The method of claim 4, wherein the security detection enable signal is active when the select enable signal is inactive.

6. The method of claim 1, further comprising outputting a light attack detection signal indicating whether a light attack is detected.

7. A method of detecting a light attack on a memory device having a plurality of memory cells, the method comprising:
   turning off all of the memory cells of the memory device when the memory device is not currently being accessed for a read/write operation;
   sensing a leakage current of at least one of the memory cells of the memory device when the memory device is not currently being accessed for the read/write operation; and
   detecting a light attack on the memory device when the leakage current of the one of the memory cells of the memory device is greater than a threshold when the memory device is not currently being accessed for the read/write operation.

8. The method of claim 7, further comprising sensing the leakage current of all of the memory cells of the memory device when the memory device is not currently being accessed for the read/write operation and wherein the light attack is detected when the leakage current of any one of the memory cells of the memory device that is not currently being accessed for a read/write operation is greater than a threshold.

9. The method of claim 7, wherein turning off all of the memory cells of memory blocks of the memory device that are not currently being accessed for the read/write operation comprises providing a security detection enable signal to the memory blocks are not currently being accessed for the read/write operation.

10. The method of claim 9, wherein the security detection enable signal is generated in response to a chip select enable signal for the memory device.

11. The method of claim 10, wherein the security detection enable signal is active when the chip select enable signal is inactive.

12. The method of claim 7, further comprising outputting a light attack detection signal indicating whether the light attack is detected.

13. A method of detecting a light attack on a memory device having a plurality of memory cells, the method comprising employing at least one memory cell to detect a light attack on the memory device when the memory cell is in an inactive state, and outputting a signal indicating whether the light attack is detected.

14. The method of claim 13, comprising employing all of the memory cells of the memory device to detect the light attack on the memory device.

15. A memory device, comprising:
   a plurality of memory cells;
   an arrangement for turning off all of the memory cells in response to a security detection enable signal; and
   a detection circuit operatively connected to the memory cells for detecting leakage currents of the turned-off memory cells and for detecting a light attack on the memory device when the leakage current of one of the memory cells of the memory device is greater than a threshold.

16. The memory device of claim 15, wherein the memory cells are arranged in word lines and column lines, the memory device further comprising a plurality of sense amplifiers each connected to one of the column lines for sensing a current through the memory cells connected to the column line and for providing a sensed current output to the detection circuit.

17. The memory device of claim 16, wherein the detection circuit comprises a plurality of detectors, each detector being connected to one of the sense amplifiers and for detecting the sensed current output in response to the security detection enable signal.

18. The memory device of claim 17, wherein each detector comprises:
a first latch for latching the security detection enable signal in synchronization with a clock signal;
a first logic circuit for logically combining the latched security detection enable signal and a sensed current output of one of the sense amplifiers and providing a sensed leakage current signal;
a second latch for latching the sensed leakage current signal in synchronization with the clock signal.

19. The memory device of claim 18, further comprising a second logic circuit for logically combining the latched sensed leakage current signals of each of the detectors.

20. The memory device of claim 16, wherein the detection circuit comprises:
a first latch for latching the security detection enable signal in synchronization with a clock signal;
a plurality of first logic circuits each for logically combining the latched security detection enable signal and a sensed current output of one of the sense amplifiers and providing a sensed leakage current signal;
a plurality of second latches for latching the sensed leakage current signals in synchronization with the clock signal; and
a second logic circuit for logically combining the latched sensed leakage current signals.

21. The memory device of claim 15, wherein the memory cells each comprise one of a NOR cell, a split-gate cell, and a stacked-gate cell.

22. A memory device comprising a plurality of memory cells, and light attack detection means, wherein at least one memory cell is part of the light attack detection means for the memory device when the memory cell is in an inactive state.

23. The memory device of claim 22, wherein the memory cells each comprise one of a NOR cell, a split-gate cell, and a stacked-gate cell.

24. A smartcard, comprising:
a processor;
a memory interface unit adapted to receive memory access instructions from the processor;
a memory device;
a bus connecting the processor, the memory interface unit and the memory device;
a security detection enable controller adapted to generate a security detection enable signal in response to the memory access instructions,
wherein the memory device comprises a plurality of memory cells, wherein a memory cell is part of a light attack detection means for the memory device when the memory cell is in an inactive state.

25. The smartcard of claim 24, wherein the memory cells each comprise one of a NOR cell, a split-gate cell, and a stacked-gate cell.

26. A smartcard, comprising:
a processor;
a memory interface unit adapted to receive memory access instructions from the processor;
a memory device;
a bus connecting the processor, the memory interface unit and the memory device;
a security detection enable controller adapted to generate a security detection enable signal in response to the memory access instructions,
wherein the memory device comprises:
a plurality of memory cells;
an arrangement for turning off all of the memory cells in response to the security detection enable signal; and
a detection circuit operatively connected to the memory cells for detecting leakage currents of the turned-off memory cells and for detecting a light attack on the memory device when the leakage current of one of the memory cells of the memory device is greater than a threshold.

27. The smartcard of claim 26, wherein the memory device further comprises a plurality of sense amplifiers each connected to one of the column lines for sensing a current through the memory cells connected to the column line and for providing a sensed current output to the detector circuit.

28. The smartcard of claim 27, wherein the detection circuit comprises a plurality of detectors, each detector being connected to one of the sense amplifiers and for detecting the sensed current output in response to the security detection enable signal.

29. The smartcard of claim 28, wherein each detector comprises:
a first latch for latching the security detection enable signal in synchronization with a clock signal;
a first logic circuit for logically combining the latched security detection enable signal and a sensed current output of one of the sense amplifiers and providing a sensed leakage current signal;
a second latch for latching the sensed leakage current signal in synchronization with the clock signal.

30. The smartcard of claim 29, further comprising a second logic circuit for logically combining the latched sensed leakage current signals of each of the detectors.

31. The smartcard of claim 27, wherein the detection circuit comprises:
a first latch for latching the security detection enable signal in synchronization with a clock signal;
a plurality of first logic circuits each for logically combining the latched security detection enable signal and a sensed current output of one of the sense amplifiers and providing a sensed leakage current signal;
a plurality of second latches for latching the sensed leakage current signals in synchronization with the clock signal; and
a second logic circuit for logically combining the latched sensed leakage current signals of each of the detectors.

32. The smartcard of claim 26, wherein the detection circuit outputs a light attack detection signal indicating whether the light attack is detected, the processing unit further comprising a reset controller for resetting the processor in response to the light attack detection signal.

33. The smartcard of claim 26, wherein the memory cells each comprise one of a NOR cell, a split-gate cell, and a stacked-gate cell.

* * * * *